United States Patent

Johansson et al.

[11] Patent Number: 5,900,681
[45] Date of Patent: May 4, 1999

[54] ELECTRIC DEVICE FOR GENERATING HIGH-VOLTAGE SQUARE PULSES

[75] Inventors: Kenneth Johansson; Christer Tornkvist, both of Vasteras, Sweden

[73] Assignee: ABB Research Ltd., Zurich, Switzerland

[21] Appl. No.: 08/913,309

[22] PCT Filed: Mar. 5, 1996

[86] PCT No.: PCT/SE96/00289

§ 371 Date: Dec. 12, 1997

§ 102(e) Date: Dec. 12, 1997

[87] PCT Pub. No.: WO96/28887

PCT Pub. Date: Sep. 19, 1996

[30] Foreign Application Priority Data

Mar. 15, 1995 [SE] Sweden .................................. 9500909

[51] Int. Cl.[6] .................................................. H03K 3/00
[52] U.S. Cl. .............................. 307/108; 327/181; 333/20
[58] Field of Search ............................... 333/20; 327/181; 307/106, 108

[56] References Cited

U.S. PATENT DOCUMENTS

| | | | |
|---|---|---|---|
| 3,345,587 | 10/1967 | Hayworth et al. .................. | 307/108 X |
| 3,433,977 | 3/1969 | Gagnon et al. ......................... | 307/106 |
| 3,496,378 | 2/1970 | Sakamoto ................................. | 307/110 |
| 4,484,085 | 11/1984 | Fallier, Jr. et al. ..................... | 307/106 |
| 4,843,518 | 6/1989 | Okumura ................................. | 307/108 |

*Primary Examiner*—Paul Gensler
*Attorney, Agent, or Firm*—Pollock, Vande Sande & Amernick

[57] ABSTRACT

A device for generation of electric square pulses with a short rise time, comprises at least an energy-storing capacitor in the form of a coaxial cable with an insulated screen, wherein essentially the whole coaxial cable is wound up in an inner closed cylindrical container of metal, a direct-voltage source for charging this screen, and devices for short-circuiting the screen to zero potential during generation of pulses. These devices together with the inner cylindrical metal container are enclosed in an outer closed container of metal, and one end of the coaxial cable is intended for connection to a load and the other end of the coaxial cable terminates with a resistor which has the characteristic impedance of the cable. Between the inner cylindrical container and the outer container, a ferrite ring-core is placed around the devices for short-circuiting and both cable ends.

6 Claims, 3 Drawing Sheets

ELECTRIC DEVICE FOR GENERATING HIGH-VOLTAGE SQUARE PULSES

TECHNICAL FIELD

The present invention relates to an electric device for generating high-voltage pulses with a short rise time which is based on a coaxial cable as an energy-storing capacitor and a quick-action electric contact

BACKGROUND OF THE INVENTION

Fast and high-voltage electric pulses are needed within many technical fields, substantially for either simulating current and voltage pulses which may damage electric equipment, or for feeding equipment with pulses suitable for its function, for example piezoelectric tranducers which convert a voltage pulse into an acoustic pulse.

Fast electric pulses, that is, pulses with a large time derivative of the voltage dU/dt, and hence in most cases also a large current derivative dI/dt, give rise to interference effects, which both influence the shape of the pulse itself and other equipment through one or more of the following effects:

capacitive currents caused by the voltage derivative induced voltage caused by the current derivative electromagnetic radiation caused by the current and/or voltage derivative reflections of the impulse at locations with a changed characteristic impedance.

Some of the effects on the pulse shape are reduced steepness (increased rise time), ringings (superimposed oscillations), and reflected signals which may be both superimposed on the pulse itself and arrive after the actual pulse is already terminated.

Interference on the equipment may, for example, entail distortion of a measured signal, disturbance of its function, or even permanent damage such as electric breakdown of the insulation, or destruction of a semiconductor element by overvoltages.

The above-mentioned interference effects may be reduced by a combination of suitable electromagnetic shielding, overvoltage protective means, and careful design of the pulse generator. The knowledge and the technique within this field are well-established. In one embodiment of such an impulse generator, the coaxial cable is grounded in the cable screen whereas one end of the inner conductor is connected to a direct-voltage source with a high-ohmic charging resistor. The other end of the cable is connected to a load via a spark gap acting as a quick-closing electric contact. All the way from the end of the cable through the spark gap to the load, the signal path is designed with such a geometry that the same characteristic impedance as that of the cable is retained. If the load itself then terminates with the same resistance, the pulse is not reflected back into the cable. Also in case of an otherwise careful design, such a generator provides high-quality square pulses.

However, the above-mentioned embodiment has the disadvantage that it needs to be terminated with a load which has the same resistance as the characteristic impedance (matching) of the coaxial cable. A typical and very common value is 50 ohm. The actual load is often a high-impedance load, for example an insulation material, and must therefore be connected in parallel with a terminal resistance of the same value as the characteristic impedance. Then the voltage across the load is halved, so that the pulse generator must be dimensioned for twice the voltage across the load, which is a great disadvantage both from the point of view of cost and space.

For a non-matching load, a matching termination at the other end of the cable is needed instead. In this case it is suitable, instead of charging the inner conductor to high voltage, to connect it via a matching resistance to ground and instead charge the screen of the coaxial cable via a high charging resistance. If the screen is then connected to ground, a square pulse is formed which, exactly as in the above-described generator, is determined in its duration by the velocity of wave propagation and the length of the cable. The load need no longer be matched. The reflected pulse then arising is fully consumed in the matching resistance at the other end of the cable and thus cannot lead to an additional voltage pulse across the load.

A disadvantage with this type of pulse generator is that it is more difficult to minimize disturbing influence and pulse distortions than for the first-mentioned type. By energizing the screen itself, it has lost the shielding properties it possessed in the design with an energized neutral conductor. The noise level can be minimized by placing the cable in a shielding container, but it remains at an undesired high level which affects the accuracy and the quality of use.

SUMMARY OF THE INVENTION

A low noise level for a square-pulse generator with charging of the cable screen and an inner conductor grounded by a matching resistance has been obtained by designing the greater part of the cable as a cylindrical coil. The coil is positioned in a cylindrical shielded container of metal, preferably of copper. Through two holes in the cover of the container, the two cable ends with inner conductor and insulation are moved out of the container. There, also the screen of the cable is connected to it. The container in turn is positioned, in an electrically insulated manner, in an outer shielded container of metal, preferably of copper, which is grounded. Through a charging resistor, the inner container may be charged from a direct-voltage source. The cover of the outer container has four bushings for the inner conductors of the two cable ends, the voltage source and the relay control. Between the covers of the inner and outer containers, there is a quick-closing relay, for example a vacuum relay or a triggered spark gap. The cable ends and the relay are surrounded by a common ferrite ring-core. An additional ferrite core surrounds the high-voltage input. Outside the outer container, one end of the cable is connected to the load and the other end terminates with the characteristic impedance of the cable.

With a pulse generator according to the invention, high-quality square pulses are achieved also for a non-matching load.

DETAILED DESCRIPTION OF THE PREFERRED EMBODIMENT

Figure 1:
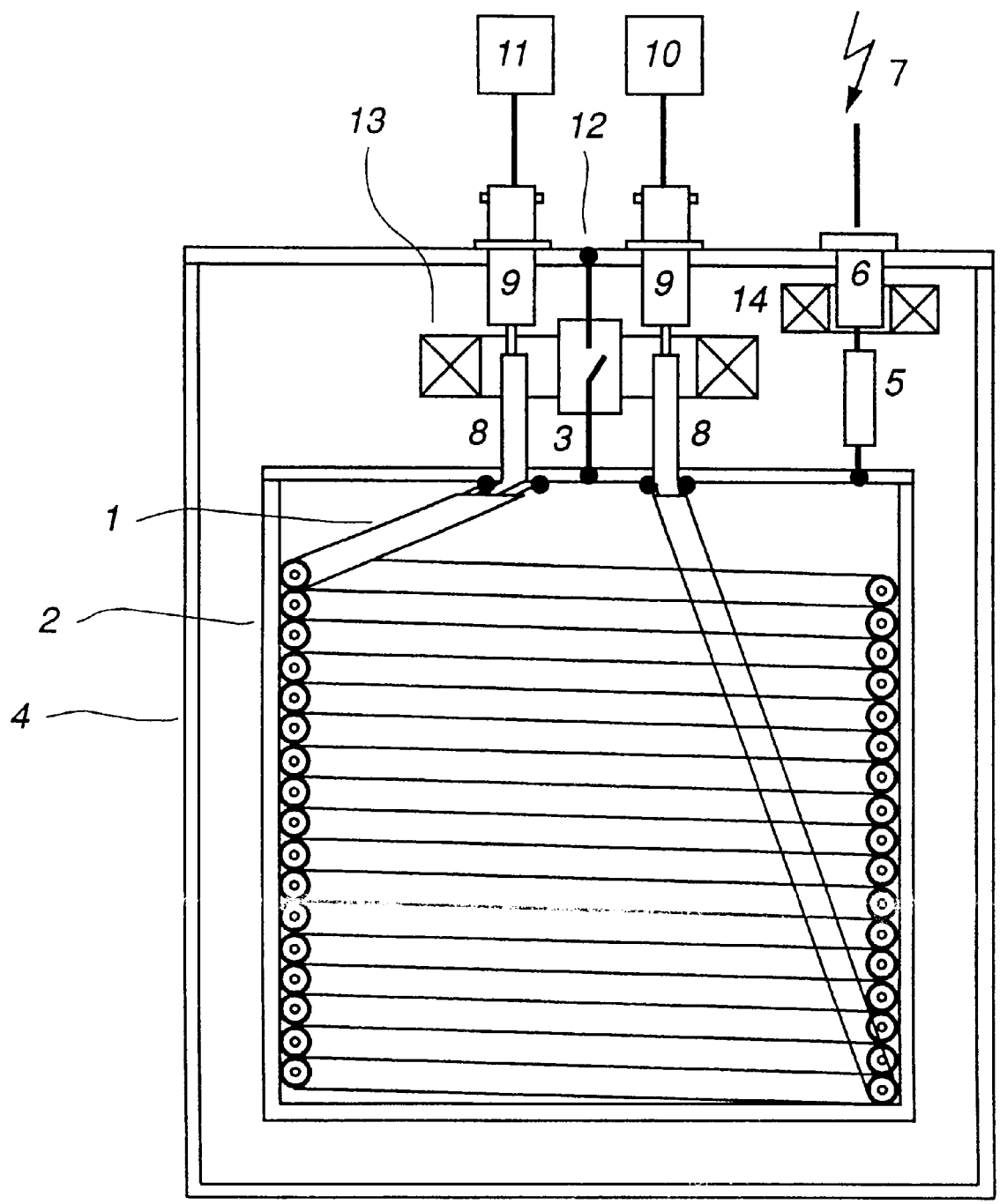
FIG. 1 illustrates the fundamental composition of the pulse generator.

The capacitor of the pulse generator consists of a coaxial cable 1 arranged in the form of a coil and housed in a cylindrical and electrically conducting inner container 2 which is connected, by means of a fast relay 3, to an electrically conducting outer container 4. The coaxial cable consists of an inner conductor surrounded, as seen from the inside, by an electrical insulation, an electrically conducting screen, and an electrically insulating casing.

Through a high-ohmic charging resistor 5 and a shielded high-voltage contact 6 in the outer container, the inner container is connected to a source of high voltage 7. The two ends 8 of the coaxial cable are passed through two holes out of the inner container. There, the shield is electrically connected to the inner container. Through two coaxial bushings 9 in the outer container, one end of the inner conductor is connected to a terminal resistor 10 with the characteristic impedance of the coaxial cable and the other end coaxially to the load 11. For the relay control 12 there is an additional contact in the outer container. Between the inner and outer containers, the two ends of the inner conductor and the relay are surrounded by a common ferrite ring-core 13. A ferrite ring-core 14 is placed around the high-voltage contact 6.

To produce a pulse, the inner container 2 and the cable screen are charged through the charging resistor 5 from the direct-voltage source 7. The charging resistor is so high-ohmic as to protect the direct-voltage source from repercussions of the pulse generation. When the relay 3 closes, the inner container 2 and the shield of the cable are connected to ground. The stored energy is emitted as two identical square pulses through the coaxial contacts 9. The length of the pulse is determined by the length of the coaxial cable 1 divided by the velocity of wave propagation of the cable (the velocity of light in vacuum divided by the root of the dielectric constant of the cable insulation material). For the usual polyethylene insulation, this gives a pulse length of about 5 ns per meter of coaxial cable. By choosing the correct distance between the relay and the neutral conductor 8 of the coaxial cable, an acceptable adaptation is obtained even over this distance.

All reflected pulses from the load 11 may pass through the pulse generator and are terminated by the resistor 10 for as long as the relay is closed.

Figure 2:
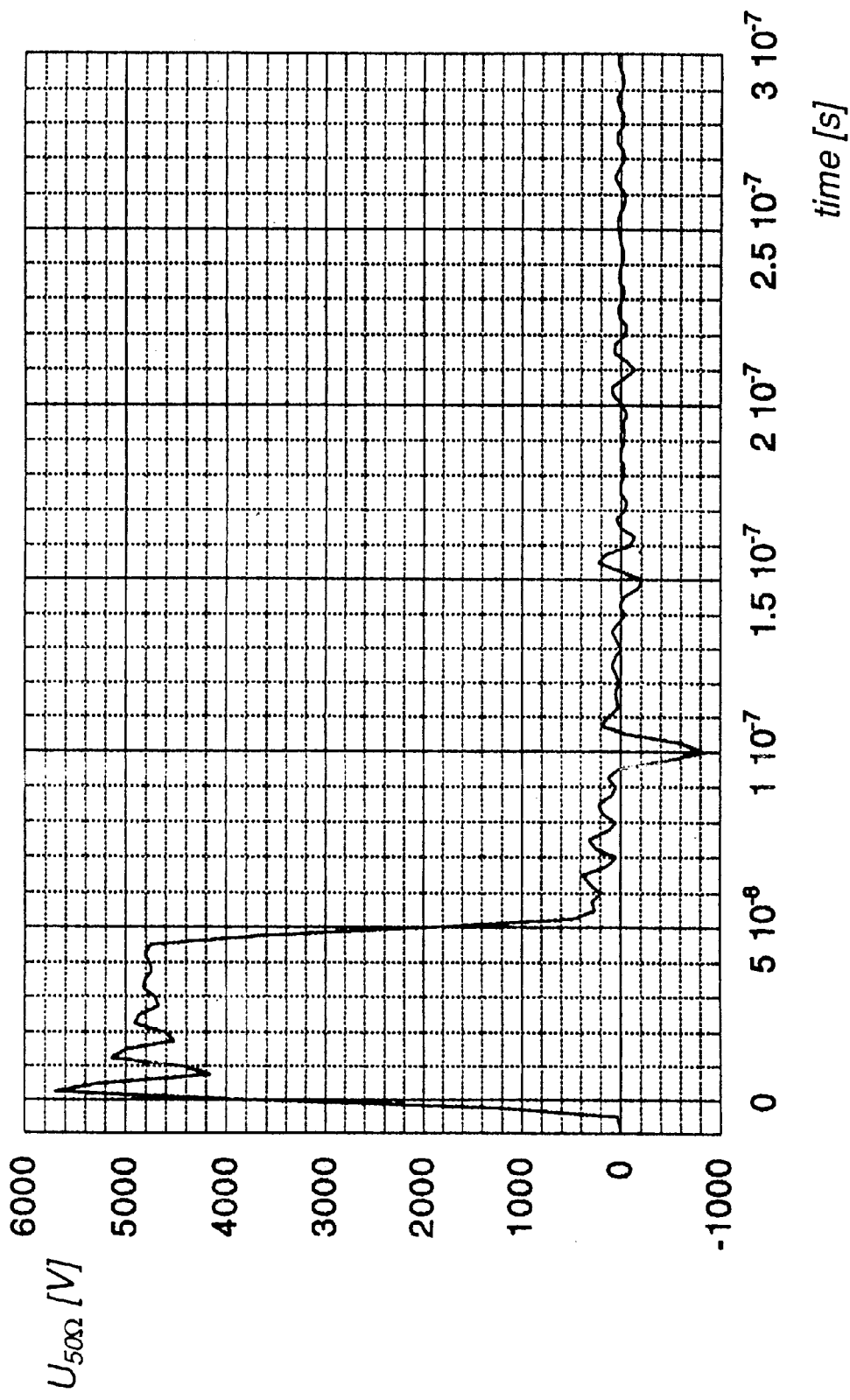
FIG. 2 shows a typical pulse of the pulse generator according to the present invention using load without a ferrite ring-core.

FIG. 2 shows a typical pulse generated by a pulse generator according to the invention with a vacuum relay and 10 m of coaxial cable, a 50 ohm characteristic impedance, and a 50 ohm resistance as load without the ferrite core 13. Oscillations, superimposed on the square pulse, are clearly visible and by the choice of a matching load, the square pulse is not concealed by reflections from the load. The capacitance between the inner container 2 and the outer container 4 and the inductance of the relay constitute a resonance circuit which starts oscillating when the relay is closed and hence causes an oscillating voltage which is superimposed on the output signal.

Figure 3:
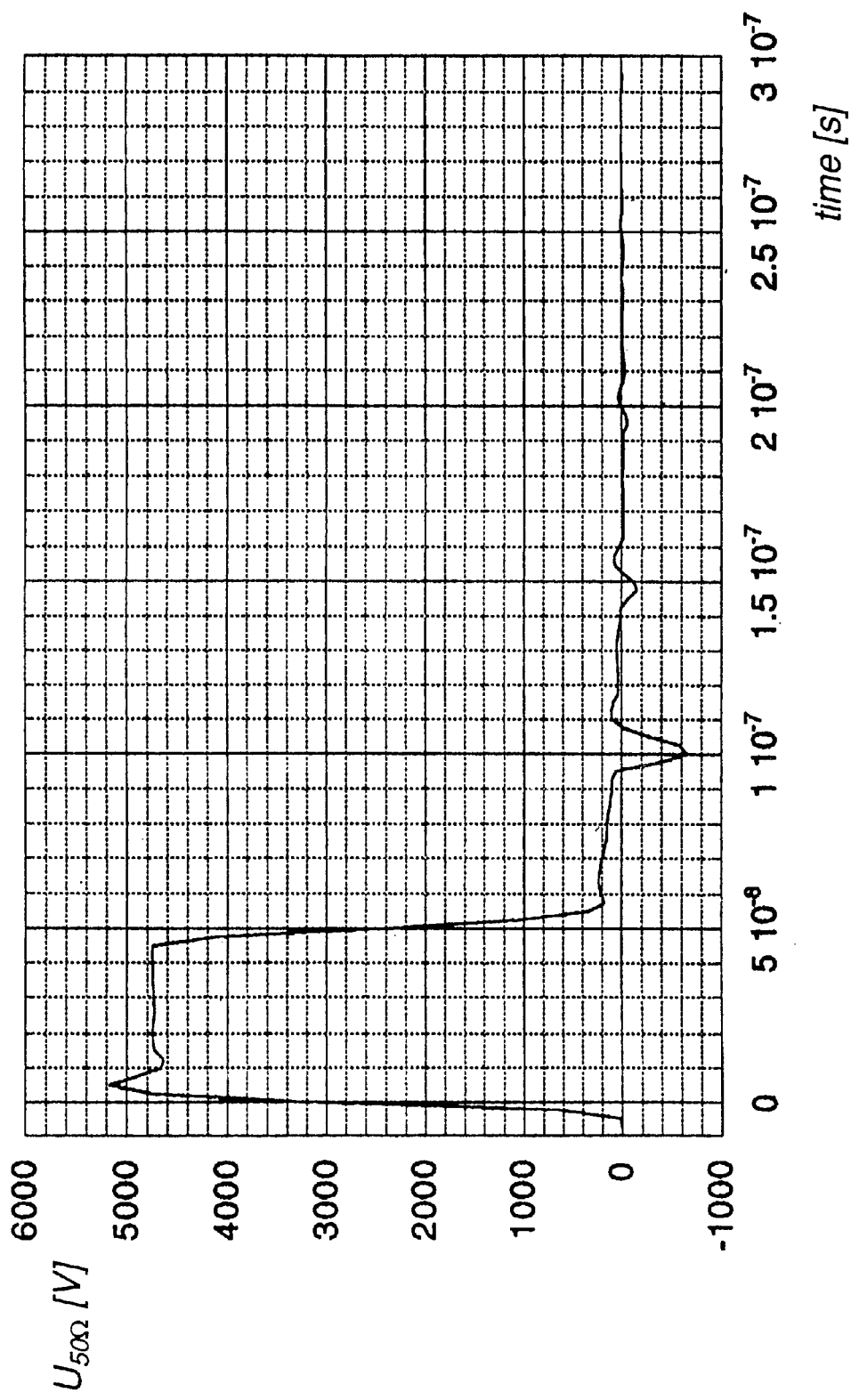
FIG. 3 shows a signal as in FIG. 2 but using load with a ferrite ring-core.

By the location of the ferrite ring-core 13 around the relay and the output cables 8, these ringings on the output signal are reduced. FIG. 3 shows the signal under the same conditions as in FIG. 2, but with a ferrite ring-core 13. By choosing a different type of ring-core, the signal can be further improved.

The ferrite ring-core 14 around the high-voltage input suppresses interference pulses passing to the high-voltage source 7.

In the prototype described here, the distance between the relay and the neutral conductors is not optimized for impedance matching, which leads to a reflection at the transition between the inner container and the outer container. This is the explanation of the interference at 100, 150 and 200 ns in FIG. 3.

We claim:

1. A device for generation of electric square pulses with a short rise time, comprising at least one energy-storing capacitor in the form of a coaxial cable with an insulated screen, wherein essentially the whole coaxial cable is wound up in an inner closed cylindrical metal container, a direct-voltage source for charging the screen, and means for short-circuiting the screen to zero potential during generation of pulses, wherein the means for short-circuiting together with said inner cylindrical metal container are enclosed in an outer closed metal container and wherein one end of the coaxial cable is intended for connection to a load, the device further including between the inner cylindrical container and the outer container, a ferrite-ring-core placed around the means for short-circuiting and both cable ends, and wherein the other end of the coaxial cable terminates with a resistor (10) which has the characteristic impedance of the cable.

2. A device according to claim 1, wherein the means for short-circuiting the screen of the coaxial cable comprises a relay.

3. A device according to claim 1, wherein between the inner cylindrical container and the outer container, a ferrite ring-core is placed around high-voltage contact.

4. A device according to claim 1, wherein the inner cylindrical container is made of copper.

5. A device according to claim 1, wherein the outer container is made of copper.

6. A device according to claim 1, wherein the outer container is cylindrical.

* * * * *